(12) United States Patent
Ichimaru

(10) Patent No.: US 6,556,087 B2
(45) Date of Patent: Apr. 29, 2003

(54) FRACTIONAL FREQUENCY DIVISION FREQUENCY SYNTHESIZER HAVING ROUNDED PHASE CONTROL VALUE

(75) Inventor: Kouzou Ichimaru, Ohita Ken (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/827,389

(22) Filed: Apr. 5, 2001

(65) Prior Publication Data

US 2001/0038314 A1 Nov. 8, 2001

(30) Foreign Application Priority Data

Apr. 5, 2000 (JP) .................................... 2000-102964

(51) Int. Cl.[7] ............................................. H03L 7/18
(52) U.S. Cl. ....................................... 331/10; 331/11
(58) Field of Search ............................. 331/10, 11, 17, 331/25, 78

(56) References Cited

U.S. PATENT DOCUMENTS

| | | | |
|---|---|---|---|
| 5,014,231 A | * 5/1991 | Reinhardt et al. | 327/107 |
| 5,038,117 A | * 8/1991 | Miller | 331/1 A |
| 5,065,256 A | * 11/1991 | Suganuma et al. | 358/3.19 |
| 5,821,816 A | * 10/1998 | Patterson | 327/105 |

FOREIGN PATENT DOCUMENTS

JP 9911122106 A 3/1999

* cited by examiner

Primary Examiner—Robert Pascal
Assistant Examiner—Joseph Chang
(74) Attorney, Agent, or Firm—William B. Kempler; W. James Brady; Frederick J. Telecky, Jr.

(57) ABSTRACT

In a frequency synthesizer 1 that has a high spurious component elimination ratio, if the integer frequency division value is changed and a fractional frequency division value is to be generated, rounding circuit 6 rounds the random number generated by random number generation circuit 7. Based on the integer value that is thereby generated, frequency division value control circuit 5 generates an integer frequency division value. Because the integer frequency division value changes based on a random number, there is no regularity, and spurious components are never generated in output signal OUT. Even if compensation circuit 37 generates a compensation current and superimposes it on the output of charge pump circuit 35, the influence of the ripple current output from charge pump circuit 35 cannot be completely eliminated. However with frequency synthesizer 1 of this invention, there is no regularity in the changes in the integer frequency division value, so even in this case, no spurious components arise in output signal OUT.

5 Claims, 3 Drawing Sheets

US 6,556,087 B2

FRACTIONAL FREQUENCY DIVISION FREQUENCY SYNTHESIZER HAVING ROUNDED PHASE CONTROL VALUE

TECHNICAL FIELD OF THE INVENTION

This invention concerns the technical field of frequency synthesizers; specifically, it concerns a frequency synthesizer that can suppress the generation of spurious components.

BACKGROUND OF THE INVENTION

Frequency synthesizers that employ a fractional frequency division type PLL circuit are known as circuits that can yield signals of the desired frequency and pull in frequencies at high speed. At present, for example, frequency synthesizers have been realized that can pull in a frequency in 300 microseconds or less even if the channel interval in the 800-MHz band is set to 25 kHz. In integer frequency division PLL, this can be called a major feature, as against a limit of only about 1.5 milliseconds at most. With regard to phase noise characteristics as well, it is about 10–20 dB better with respect to the integer type.

Such performance has made frequency synthesizers that employ fractional frequency division type PLL circuits indispensable devices in the field of wireless communication.

Symbol 101 in FIG. 4 is an example of a conventional-technology frequency synthesizer that employs the fractional frequency division method; it has oscillator 131, frequency divider 132, clock generator 133, phase comparator 134, charge pump circuit 135, low-pass filter 136, compensation circuit 137, and frequency division value setting circuit 138.

Formed from these circuits is a negative feedback loop as described below; it is composed in such a way that signals output from the charge pump circuit are input via low-pass filter 136 into oscillator 131, output signal OUT of a frequency corresponding to the size of the signal is output to external circuits and frequency divider 132.

To describe the negative feedback loop of this frequency synthesizer 101, first, output signal OUT output by oscillator 131 is input into frequency divider 132, output signal OUT is frequency-divided by the integer frequency division value set inside frequency divider 132, and the frequency-divided signal is input into phase comparator 134.

Phase comparator 134 inputs the frequency-divided signal and the basic clock signal output by clock generator 133, generates a signal that corresponds to the phase difference between the two signals, and outputs it to charge pump circuit 135.

Charge pump circuit 135 is constituted so as to output a fixed current just for the time corresponding to the signal input from phase comparator 134, and the signal according to this fixed current is input through low-pass filter 136 into oscillator 131.

If the signal output by charge pump circuit 135 indicates that the frequency of the output signal of frequency divider 132 is higher than the frequency of the standard clock signal, oscillator 132 will lower the frequency of output signal OUT, and conversely, if it indicates that the frequency of the output signal of frequency divider 132 is lower than the frequency of the standard clock signal, it will raise the frequency of output signal OUT.

As a result, oscillator 131 operates so as to make the error signal output by phase comparator 134 small, so that overall a negative feedback loop is formed, and output signal OUT remains stable at the prescribed frequency.

The frequency division value set inside said frequency divider 132 is an integer frequency division value, but the size of the integer frequency division value is controlled by frequency division value setting circuit 138, and the construction is such that the value changes periodically. As a result of the integer frequency division value changing periodically, the value to which the integer frequency division values are averaged becomes the fractional frequency division value, so a signal is obtained of a frequency that is a fractional frequency division value multiple of the standard clock signal.

For example, if (5000+⅛) is necessary as the fractional frequency division value, then the value that is the average of the integer frequency division values during the time period of 8 periods, that is, the fractional frequency division value becomes (5000+⅛) if, during eight continuous periods of the standard clock signal, the integer frequency division value is set to 5000 for just 7 periods, and the integer frequency division value is set to 5001 for the remaining 1 period.

In this case, because the integer frequency division value changes, the output voltage of charge pump 135 constantly changes, but the output of charge pump 135 is averaged by low-pass filter 136, so when the 8-period time period is averaged, the frequency of the signal output by frequency divider 132 and the frequency of the standard clock signal will agree. As a result, the frequency of output signal OUT of oscillator 131 will be stable at a value that is fractional frequency division value (5000+⅛) times the standard clock signal.

But because the integer frequency division value changes as described above, even if output signal OUT is stable, the phase of the signal output by frequency divider 132 and the phase of the standard clock will never agree completely. Therefore every time phase comparator 134 operates, an error signal is output from phase comparator 134 (depending on the value of the fractional frequency division value, there may be a period during which no error signal is output, even if phase comparator 134 operates), and a ripple current of a size that corresponds to the phase difference is output from charge pump circuit 135.

To describe this ripple current, FIG. 5(a) is a timing chart of output signal OUT of frequency divider 132 versus the standard clock signal in the case when the fractional frequency division value is (5000+⅛). Symbol CLK in this diagram denotes the timing of the standard clock signal, and symbols T1–T8 denote phases of output signal OUT of frequency divider 132.

W1–W8 express the amount of phase error between phases T1–T8 of each output signal OUT of frequency divider 132 and standard clock signal CLK. These error amounts W1–W8 include delay error amounts W1–W4 and advance error amounts W5–W8, but the total value of the delay error amounts W1–W4 and the total value of the advance error amounts W5–W8 are equal. Therefore, as described above, when the phase of output signal OUT is time-period averaged for 8 periods, it is equal to the phase of standard clock signal CLK.

Symbols R1–R8 in FIG. 5(b) denote the output time periods of the ripple current that is output from charge pump circuit 135 when said phase error amounts W1–W8 arise. Because charge pump circuit 135 is a fixed current output, the amount of electric charge of the respective ripple currents is proportional to the output time period. Denoting by +/−q the amount of electric charge of the ripple current at minimum error amounts W4 and W5, the amount of electric charge of the ripple currents corresponding to error amounts W1–W8 is −7 q, −5 q, −3 q, −q, q, 3 q, 5 q, 7 q.

The timing and size by which such ripple current is output has a period that corresponds to the period of the integer frequency division value, so there is the problem that spurious components arise on output signal OUT.

Thus, in order to eliminate such spurious components, measures are taken even with conventional-technology frequency synthesizer 101; they are controlled by frequency division value setting circuit 138, compensation circuit 137 is provided, and by the timing by which ripple currents are output from charge pump circuit 135, a compensation current is generated that is opposite the ripple current in polarity but equal in size, and this is superimposed on output signal OUT of charge pump circuit 135, thereby eliminating the ripple current.

Symbols C1–C8 in FIG. 5(*b*) denote the charge amount of the compensation currents corresponding to the charge amounts R1–R8 of the ripple currents. The charge amount of compensation currents C1–C8 are 7 q, 5 q, 3 q, q, −q, −3 q, −5 q, −7 q.

But because of such causes as variability in manufacture, with conventional-technology frequency synthesizer 101 it is difficult to ensure that the amount of electric charge of the compensation currents agrees completely with the amount of electric charge of the ripple currents. Therefore there are cases in which the ripple current cannot be completely eliminated.

If the ripple current cannot be eliminated completely, its effect will have periodicity, so spurious components will remain in output signal OUT. Taking manufacturing variability into consideration, the rate of reduction in spurious components by compensation circuit 137 will vary in a range of about 40 dB to 30 dB.

SUMMARY OF THE INVENTION

A general purpose of this invention, which was created in order to solve the above drawbacks of the conventional technology, is to provide technology by which the rate of reduction of spurious components can be increased.

According to one aspect of the invention, the frequency synthesizer of this invention has an oscillator that controls the frequency of an oscillation signal in accordance with a control signal, a fractional frequency division type frequency divider that frequency-divides said oscillation signal and generates a comparison signal, a standard clock signal generator that generates a standard clock signal, a phase comparator that compares the phase of said comparison signal and the phase of said standard clock signal and outputs a phase difference signal, a charge pump circuit that outputs a current in accordance with said phase difference signal, a low-pass filter that eliminates the higher harmonics of the current that is output from said charge pump circuit and supplies it to said oscillator as said control signal, a compensation circuit that supplies to the output terminal of said charge pump circuit a compensation current for compensating the ripple current included in said control signal, and a frequency division value setting circuit that nonperiodically alters the frequency division value of said frequency divider.

Another aspect of this invention is a frequency synthesizer as described above in which said frequency division value setting circuit has a random number generator and a frequency division value control circuit that, based on random numbers generated by said random number generator, determines integer frequency division values for determining the fractional frequency division value of said frequency divider and outputs said integer frequency division value to said frequency divider.

A further aspect of this invention is a frequency synthesizer as described above in which the integer frequency division values output to said frequency divider are controlled so as to be within the prescribed range.

With this invention, being comprised as describe above, periodicity does not appear when the integer frequency division values for making fractional frequency division values are changed. Therefore, spurious components of the output signal caused by ripple current do not arise.

Even if a compensation current is superimposed on the output of the charge pump circuit and the ripple current is eliminated, the effect of the ripple current will remain, but even in that case, there is no periodicity in the effect of the ripple current, so no spurious components will arise in the output signal.

Because the capacity of the compensation circuit imposes restrictions on the size of the compensation current that can be generated, in this invention the integer frequency division values are controlled so that when the integer frequency division value is changed, the phase difference between the frequency of the signal obtained by integer-frequency-dividing the output signal and the standard clock signal does not exceed the capacity of the compensation current.

DETAILED DESCRIPTION OF THE PREFERRED EMBODIMENTS

Figure 1:
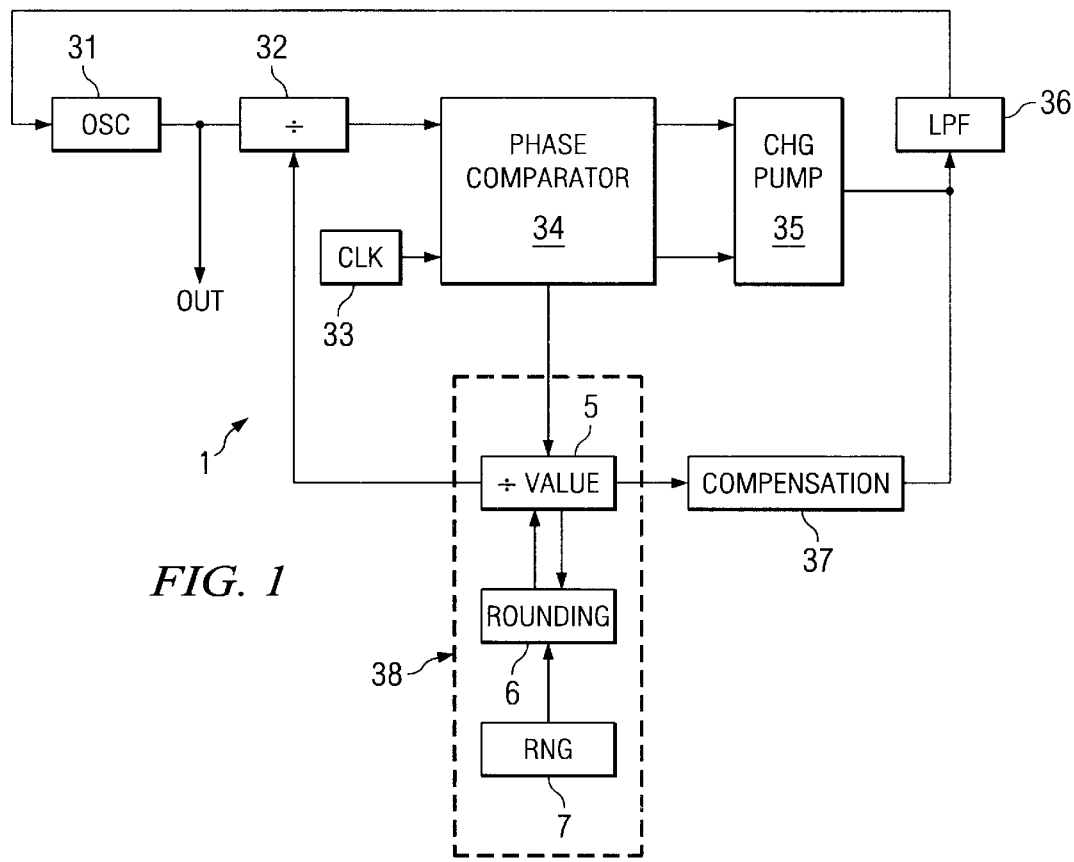
FIG. 1 Block diagram of the frequency synthesizer of an example of this invention.

Referring to FIG. 1, symbol 1 denotes the frequency synthesizer of an example of this invention, and it has oscillator 31, frequency divider 32, clock generator 33, phase comparator 34, charge pump circuit 35, low-pass filter 36, compensation circuit 37, and frequency division value setting circuit 38.

In this frequency synthesizer 1, a negative feedback loop similar to that in aforesaid conventional-technology frequency synthesizer 101 is formed, and output signal OUT of oscillator 31 is input into frequency divider 32 and is frequency-divided by an integer frequency division value.

The signal, after having been frequency-divided, is input into phase comparator 34, is compared with the phase of the standard clock signal output by clock generator 33, and a signal corresponding to the phase difference between the two signals is output to charge pump circuit 35. Charge pump circuit 35 outputs current of an electric charge amount corresponding to the phase difference, and this signal goes through low-pass filter 36 and is input into oscillator 31.

Oscillator 31 is constructed so as to output output signal OUT, which is of a frequency corresponding to the signal that is input, to an external circuit and frequency divider 32. Oscillator 31 changes the frequency of output signal OUT in the direction so as to make small the error signal output by phase comparator 34.

Provided inside frequency division value setting circuit 38 of this invention are frequency division value control circuit 5, rounding circuit 6, and random number generation circuit 7.

Random number generation circuit 7 is constituted so as to generate internally random numbers in a prescribed range and output them to rounding circuit 6. If an integer frequency division value is set within frequency divider 32, first, the random number value generated within random number generation circuit 7 is input into rounding circuit 6, and within rounding circuit 6 it is rounded to an integer value in the prescribed range. The rounded integer value is output to frequency division value control circuit 5.

Frequency division value control circuit 5 generates an integer frequency division value based on the integer value that has been input to it, and outputs it to frequency divider 32. Frequency divider 32 stores the integer frequency division value that has been input to it, and frequency-divides output signal OUT, which has been input to it, by its set integer frequency division value.

Frequency division value control circuit 5 is constituted so as to control compensation circuit 37, generate a compensation current that is opposite in polarity and equal in size to the ripple current that is output from charge pump circuit 35, and superimpose it on the signal that is output by charge pump circuit 35.

Denoting by q the minimum amount of electric charge of the ripple current, compensation circuit 37 is constituted so as to be able to generate a compensation current of +/−15 q. Therefore the change in the integer frequency division value is restricted so that the amount of electric charge of the ripple current is no greater than +/−15 q, so as not to exceed the capacity of this compensation circuit 37.

For example, if the fractional frequency division value is set to 5000+⅜, then by frequency synthesizer 1 of this invention the integer frequency division value is made to change like, for example, 5000, 5003, 4999, 5001, 5001, 5000, 4999, 5003, 4999, 5000, 5000, 5001, . . . so as to keep the ripple current when time division is done by each integer time division value in the range of +/−15 q.

The ripple currents that correspond to the above changes in the integer frequency division values are −15 q, 6 q, −5 q, 0, 5 q, 2 q, −9 q, 12 q, q, −2 q, −5 q, 0, . . .

In order to eliminate this ripple current, it suffices for compensation circuit 37 to output compensation currents having electric charge amounts 15 q, −6 q, 5 q, 0, −5 q, −2 q, 9 q, −12 q, −q, 2 q, 5 q, 0, . . .

Also, in the case of a conventional-technology frequency synthesizer, even if the fractional frequency division values are the same value, because it changes like 5000, 5000, 5001, 5000, 5000, 5001, 5000, 5000, 5000, 5000, 5001, 5000, . . . , ripple currents are output like −7 q, −1 q, +5 q, −5 q, −1 q, +7 q, −3 q, +3 q, −7 q, −1 q, +5 q, −5 q, . . . , and the ripple currents have periodicity. Therefore if even a little effect of the ripple currents remains, its effect will have periodicity, so spurious components will be generated in output signal OUT.

In contrast to this, with the frequency synthesizer of this invention, there is no periodicity in the changes in ripple current as described above, so even if the ripple current cannot be completely eliminated by compensation current, spurious components will not arise on output signal OUT.

Figure 2:
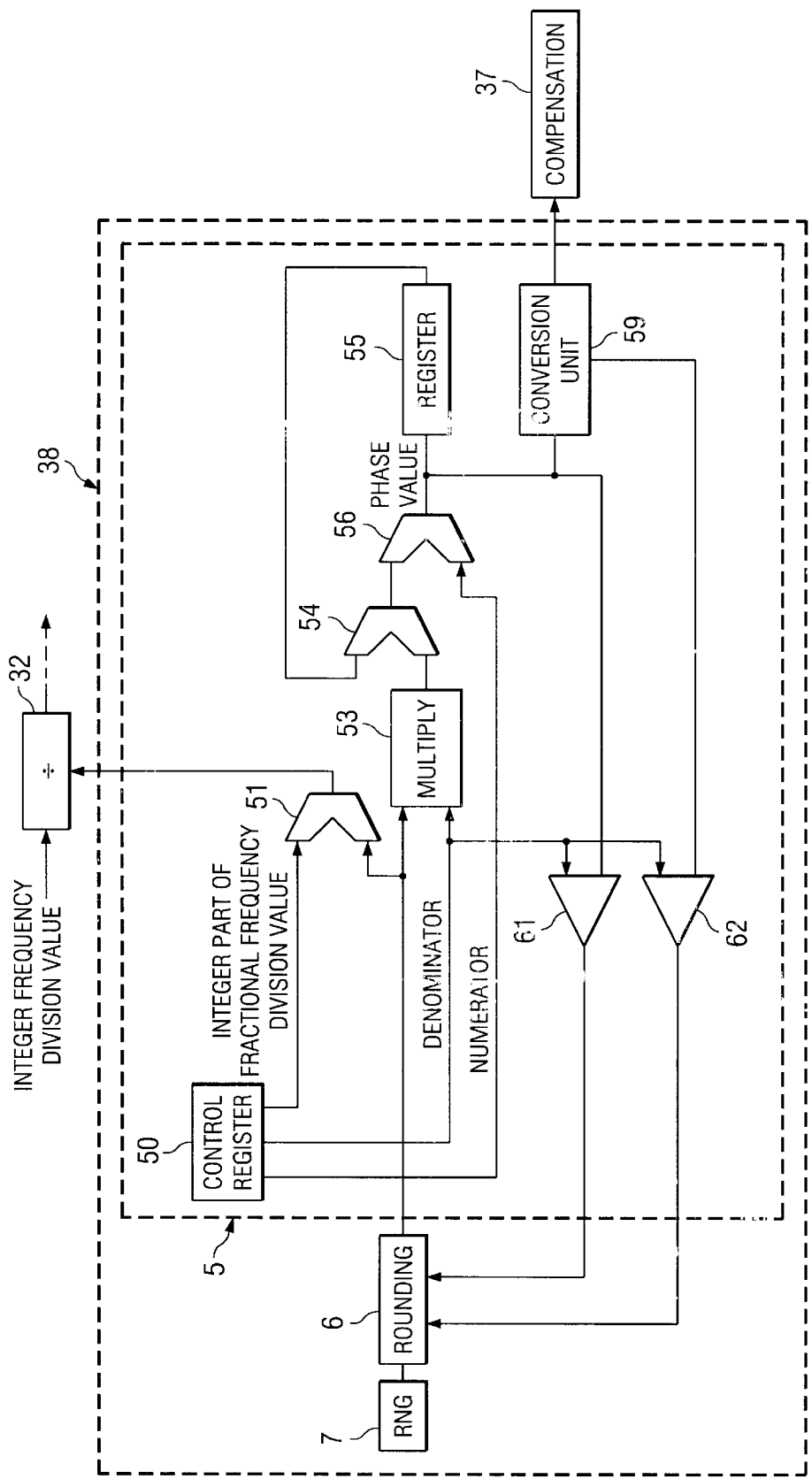
FIG. 2 Internal block diagram of its frequency division value control circuit.
Figure 4:
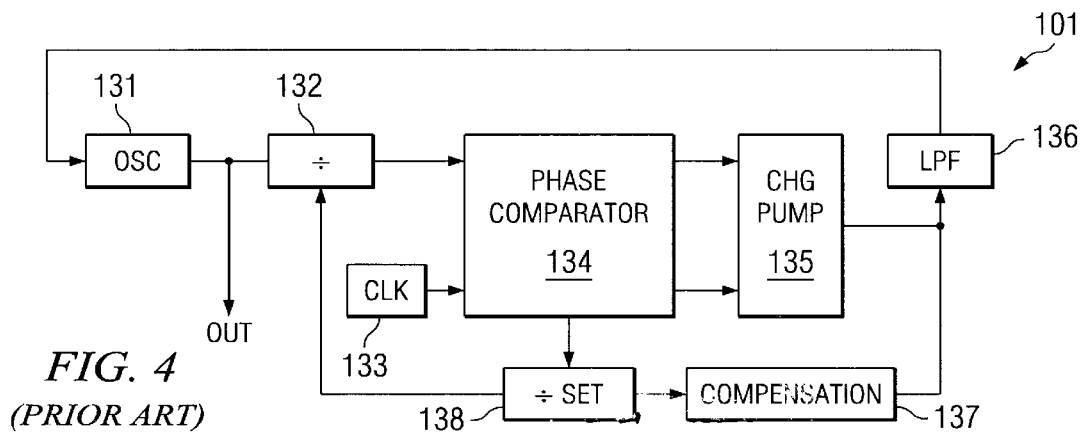
FIG. 4 Diagram for describing a conventional-technology frequency synthesizer.
Figure 5A:
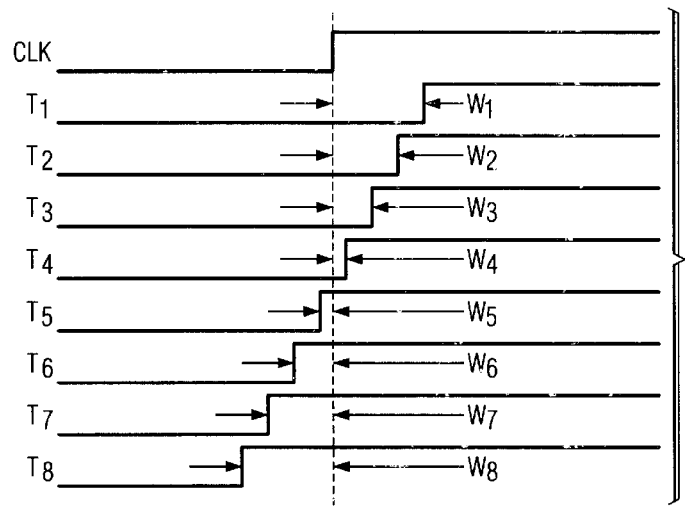
FIGS. 5(*a*), (*b*): Timing chart for describing ripple currents and compensation currents. Explanation of the Symbols 1 . . . frequency synthesizer
5 . . . frequency division value control circuit
6 . . . rounding circuit
7 . . . random number generation circuit
31 . . . oscillator
32 . . . frequency divider
34 . . . phase comparator
35 . . . charge pump circuit
36 . . . low-pass filter
37 . . . compensation circuit
38 . . . frequency division value setting circuit
Figure 5B:
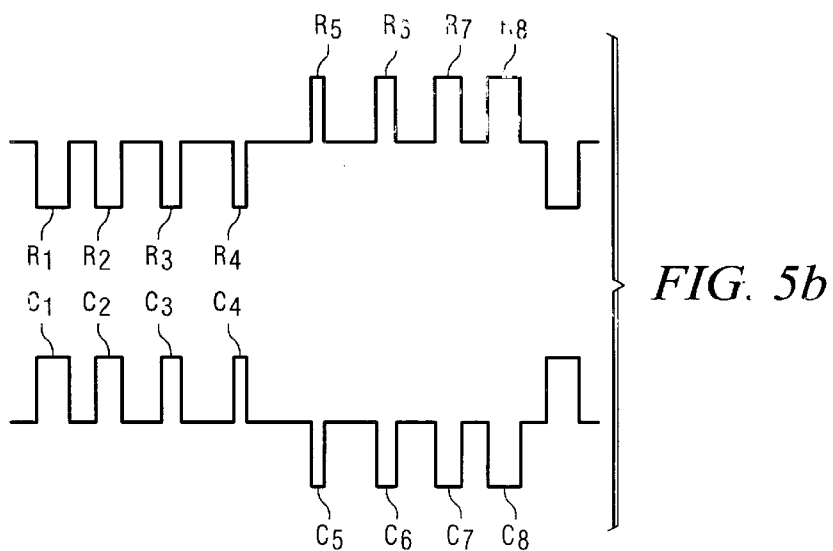

An internal block diagram of frequency division value control circuit 5 is shown in FIG. 2. Symbol 51 in FIG. 2 denotes an adder, and the integer value output by rounding circuit 6 is input into this adder 51.

Symbol 50 in the same diagram denotes a control register inside frequency division value control circuit 5. The fractional frequency division value is held in this control register 50, and it outputs the value of the integer part of this fractional frequency division value, the value of the denominator of the part to the right of the decimal point, and the value of the numerator.

Input into adder 51 are the value of the integer part of the fractional frequency division value output by control register 50, and the integer value that is output by rounding circuit 6.

Inside this adder 51, the integer value that is output from rounding circuit 6 and the value of the integer part of the fractional frequency division value are added together, becoming an integer frequency division value which is output to frequency divider 32. Frequency divider 32 holds the integer frequency division value that is input into it, and frequency-divides output signal OUT with this value.

The integer value that is output by rounding circuit 6 is input into, besides adder 51, multiplier 53. The value of the denominator that is output by control register 50 is also input into this multiplier 53, and the integer value that is input from rounding circuit 6 is multiplied together with the value of this denominator and is output to adder 54.

Input into this adder 54 is, besides the output of multiplier 53, the value held in register 55. The value held in register 55 indicates the phase difference with the standard clock signal if output signal OUT is frequency-divided by the pre-change integer frequency division value.

Adder 54 adds together the value in register and the output of multiplier 53 and outputs it to next-stage adder 56.

This adder 56 adds together the output of previous-stage adder 54 and the value of the numerator output by control register 50 and determines the phase difference that arises with the standard clock signal if output signal OUT is frequency-divided by the after-change integer frequency division value.

This value is input into and stored in register 55 and is output to next-stage conversion circuit 59. Conversion circuit 59 determines from the value that is input to it, and outputs to compensation circuit 37, the value that corresponds to the compensation current that is necessary when output signal OUT is frequency-divided by the new integer frequency division value.

Compensation circuit 37 generates from the value that is input to it a compensation current of an amount of electric charge that corresponds to the ripple current, and superimposes the compensation current on the output of charge pump circuit 35 with the timing by which the ripple current is output.

The phase value output by adder 56 and the value indicating the amount of electric charge of the compensation current output by conversion circuit 59 are input into two comparators 61 and 62, respectively, and comparators 61 and 62 compare them with the value corresponding to the value of the denominator output by control register 50, and output their comparison results to rounding circuit 6. What suffices as the value corresponding to the value of this denominator is any value based on the value of the denominator, such as the value obtained by multiplying the value of the denominator by an integer.

Rounding circuit 6 detects from the comparison results of comparators 61 and 62 whether the phase value and the amount of electric charge of the compensation current are within the prescribed range. If the phase value or the amount of electric charge of the compensation current is too big, rounding circuit 6 re-outputs an integer value and revises the integer frequency division value.

Thus, because the difference between the pre-change integer frequency division value and the after-change integer frequency division value does not become very large, the amount of electric charge of the compensation current does not exceed the capacity of compensation circuit 37.

Also, in this invention, there is no need to necessarily have a composition whereby random number generation circuit 7 generates random numbers. For example, one may use multiple M-series linear feedback type shift registers and generate a series of random numbers that has a long period.

Figure 3:
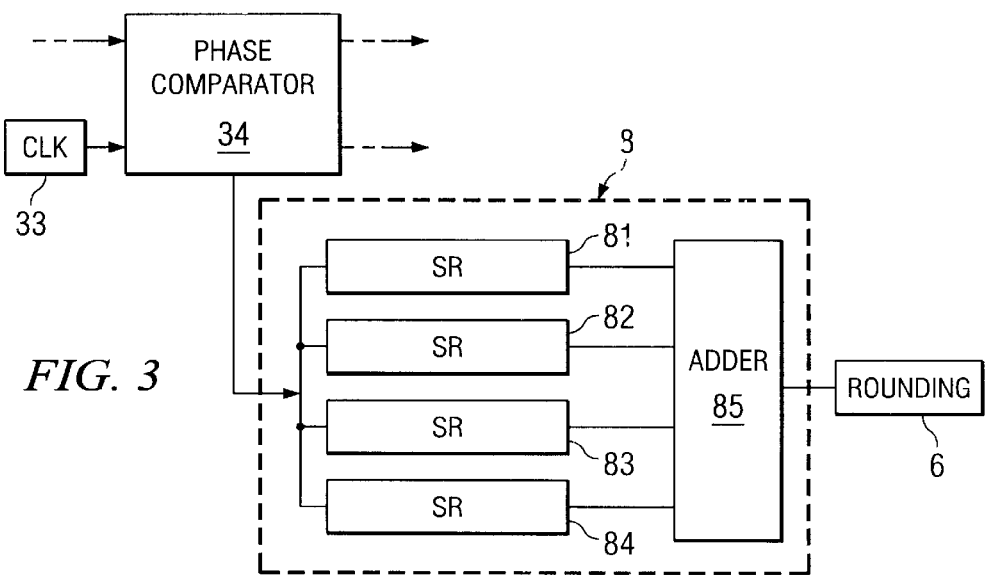
FIG. 3 Example of a random number generation circuit using M-series random numbers.

Symbol 8 in FIG. 3 is a random number generation circuit that generates an M series of random numbers and outputs an integer value in the prescribed range to rounding circuit 6.

This random number generation circuit 8 has four linear shift registers 81–84. These linear shift registers 81–84 consist of n1–n4 bits, and operate upon receiving the reset pulse of phase comparator 34.

By using four linear shift registers 81–84 of n1–n4 bits, random number values are generated that have a period of (2n1)×(2n2)×(2n3)×(2n4) (where 2**n denotes the number 2 raised to the n-th power).

The output of registers 81–84 is input into adder 85, and an integer value in the prescribed range is output to subsequent-stage rounding circuit 6. In this way, this invention can use M-series random numbers.

Also, one may pre-store random numbers to be used by the frequency synthesizer of this invention in a ROM and use it as a random number generation circuit.

The effect caused by the ripple currents has no periodicity, so no spurious components arise in the output signal.

What is claimed is:

1. A frequency synthesizer comprising an oscillator that controls the frequency of an oscillation signal in accordance with a control signal, a fractional frequency division type frequency divider coupled to the oscillator that frequency-divides said oscillation signal and generates a comparison signal, a standard clock signal generator that generates a standard clock signal, a phase comparator coupled to the frequency divider and the standard clock signal generator that compares the phase of said comparison signal and the phase of said standard clock signal and outputs a phase difference signal, a rounding circuit that determines if the phase difference signal and a compensation signal are within a predetermined range and revises a frequency division value if the phase difference signal or compensation signal are outside the predetermined range, a charge pump circuit that outputs a current in accordance with the phase difference signal, a low-pass filter that eliminates the higher harmonics of the current that is output from said charge pump circuit and supplies it to said oscillator as said control signal, a compensation circuit that supplies to the output terminal of said charge pump circuit, the compensation signal for compensating the ripple current included in said control signal, and a frequency division value setting circuit that nonperiodically alters the frequency division value of the frequency divider.

2. The frequency synthesizer as described in claim 1 wherein the frequency division value setting circuit has a random number generator and a frequency division value control circuit that, based on random numbers generated by said random number generator, determines integer frequency division values for determining the fractional frequency division value of the frequency divider and outputs said integer frequency division value to the frequency divider.

3. The frequency synthesizer of claim 1 wherein the phase is predicted with a resolution of 1/(VCO output frequency)/ (fractional denominator N).

4. The frequency synthesizer of claim 1 wherein a feedback loop from the phase comparator to the oscillator is linear.

5. The frequency synthesize of claim 4 wherein the feedback loop does not include a "truncate-to-integer" function.

* * * * *